United States Patent
Li et al.

(10) Patent No.: US 11,538,800 B2
(45) Date of Patent: Dec. 27, 2022

(54) DISPLAY DEVICE HAVING A HEAT DISSIPATION LAYER WITH A GAP SEPARATION PORTION AND MANUFACTURING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Li, Beijing (CN); Jing Wang, Beijing (CN); Jie Xiang, Beijing (CN); Li Wang, Beijing (CN); Ming Li, Beijing (CN); Na Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 331 days.

(21) Appl. No.: 16/640,420

(22) PCT Filed: Feb. 20, 2019

(86) PCT No.: PCT/CN2019/075592
§ 371 (c)(1),
(2) Date: Feb. 20, 2020

(87) PCT Pub. No.: WO2020/168492
PCT Pub. Date: Aug. 27, 2020

(65) Prior Publication Data
US 2021/0159221 A1 May 27, 2021

(51) Int. Cl.
H01L 31/0232 (2014.01)
H01L 23/34 (2006.01)
(Continued)

(52) U.S. Cl.
CPC .............. *H01L 25/18* (2013.01); *H01L 25/50* (2013.01); *H01L 27/3244* (2013.01);
(Continued)

(58) Field of Classification Search
CPC ........... H01L 2251/5338; H01L 51/529; H01L 51/5253; H01L 51/0097; H01L 23/36;
(Continued)

(56) References Cited

U.S. PATENT DOCUMENTS 10,714,562 B2 * 7/2020 Yang .................... H01L 27/3258
2013/0169515 A1 * 7/2013 Prushinskiy ........ H01L 27/3244
345/55

FOREIGN PATENT DOCUMENTS

CN 207800055 U 8/2018

* cited by examiner

*Primary Examiner* — Alonzo Chambliss
(74) *Attorney, Agent, or Firm* — Dilworth & Barrese, LLP.; Michael J. Musella, Esq.

(57) ABSTRACT

A display device and a manufacturing method thereof are provided. The display device includes a display panel, a heat dissipation layer, and a chip on film. The heat dissipation layer is on a non-display side of the display panel and includes a driving circuit arranging region and a peripheral region. The heat dissipation layer located in at least a part of the driving circuit arranging region is insulated from the heat dissipation layer located in the peripheral region. The chip on film is on a side of the heat dissipation layer away from the display panel and is in the driving circuit arranging region.

20 Claims, 4 Drawing Sheets

(51) Int. Cl.
*H01L 21/00* (2006.01)
*H05K 7/20* (2006.01)
*H05K 1/00* (2006.01)
*H01L 25/18* (2006.01)
*H01L 25/00* (2006.01)
*H01L 51/52* (2006.01)
*H01L 27/32* (2006.01)

(52) U.S. Cl.
CPC ........ *H01L 51/529* (2013.01); *H01L 27/3276* (2013.01); *H01L 2251/5338* (2013.01)

(58) Field of Classification Search
CPC ..... H01L 27/3276; H01L 25/18; H01L 25/50; H01L 2227/32
See application file for complete search history.

DISPLAY DEVICE HAVING A HEAT DISSIPATION LAYER WITH A GAP SEPARATION PORTION AND MANUFACTURING METHOD THEREOF

TECHNICAL FIELD

Embodiments of the present disclosure relate to a display device and a manufacturing method thereof.

BACKGROUND

Currently, display devices are developing toward large screens, and the requirements for display brightness are becoming higher and higher. In this case, a driving current of a display unit in a display device can be increased to ensure the demand for display brightness. However, a larger driving current tends to generate more heat, and therefore the display device usually includes a heat dissipation structure to dissipate the heat generated by the display device during a display process.

SUMMARY

At least an embodiment of the present disclosure provides a display device, comprising: a display panel, a heat dissipation layer, and a chip on film. The heat dissipation layer is on a non-display side of the display panel and comprises a driving circuit arranging region and a peripheral region, the heat dissipation layer located in at least a part of the driving circuit arranging region is insulated from the heat dissipation layer located in the peripheral region; and the chip on film is on a side of the heat dissipation layer away from the display panel, and is in the driving circuit arranging region.

For example, in the display device provided by at least an embodiment of the present disclosure, the driving circuit arranging region comprises a first portion and a second portion that are insulated from each other, the heat dissipation layer located in the first portion is insulated from the heat dissipation layer located in the peripheral region, and the heat dissipation layer located in the second portion is connected to the heat dissipation layer located in the peripheral region; and the chip on film is in contact with the heat dissipation layer located in the first portion, and the chip on film is spaced apart from the heat dissipation layer located in the second portion.

For example, in the display device provided by at least an embodiment of the present disclosure, the display panel has flexibility, the second portion is fixed to a portion, bent to the non-display side, of the display panel, and the chip on film is bonded to the portion, bent to the non-display side, of the display panel.

For example, in the display device provided by at least an embodiment of the present disclosure, a portion, bent to the non-display side, of the display panel is fixed to the second portion, and the chip on film is connected to a bonding region of the display panel on the non-display side.

For example, in the display device provided by at least an embodiment of the present disclosure, the chip on film extends to a display side of the display panel and is connected to a bonding region of the display panel.

For example, the display device provided by at least an embodiment of the present disclosure further comprises: a first flexible circuit board, on a display side of the display panel, connected to a bonding region of the display panel, and extending to the non-display side of the display panel, the first flexible circuit board is fixed to the second portion, and the chip on film is bonded to the first flexible circuit board on the second portion.

For example, in the display device provided by at least an embodiment of the present disclosure, the heat dissipation layer comprises a heat dissipation film and a buffer layer, the heat dissipation film comprises a first heat dissipation portion in the driving circuit arranging region and a second heat dissipation portion in the peripheral region, at least a part of the first heat dissipation portion is insulated from the second heat dissipation portion; the buffer layer is on a side of the heat dissipation film close to the display panel.

For example, in the display device provided by at least an embodiment of the present disclosure, a material of the heat dissipation film is metal.

For example, in the display device provided by at least an embodiment of the present disclosure, the metal comprises copper, copper alloy, silver, silver alloy, aluminum, or aluminum alloy.

For example, in the display device provided by at least an embodiment of the present disclosure, the second heat dissipation portion is grounded.

For example, in the display device provided by at least an embodiment of the present disclosure, the buffer layer is continuously disposed.

For example, in the display device provided by at least an embodiment of the present disclosure, the heat dissipation layer further comprises an adhesive layer, on a side of the buffer layer close to the display panel.

For example, the display device provided by at least an embodiment of the present disclosure further comprises a protective layer, covering the chip on film.

For example, in the display device provided by at least an embodiment of the present disclosure, the first heat dissipation portion and the second heat dissipation portion are in a same layer, and a gap is between the second heat dissipation portion and at least a part of the first heat dissipation portion.

For example, in the display device provided by at least an embodiment of the present disclosure, the gap comprises an insulation material.

At least an embodiment of the present disclosure provides a manufacturing method for manufacturing a display device, comprising: providing a display panel; disposing a heat dissipation layer on a non-display side of the display panel, the heat dissipation layer comprising a driving circuit arranging region and a peripheral region, and the heat dissipation layer located in at least a part of the driving circuit arranging region being insulated from the heat dissipation layer located in the peripheral region; and disposing a chip on film on the driving circuit arranging region.

For example, in the manufacturing method provided by at least an embodiment of the present disclosure, disposing the heat dissipation layer on the non-display side of the display panel comprises: forming the heat dissipation layer, the heat dissipation layer comprising the driving circuit arranging region and the peripheral region, and the driving circuit arranging region and the peripheral region being at least partially insulated from each other; and connecting the heat dissipation layer to the non-display side of the display panel.

For example, in the manufacturing method provided by at least an embodiment of the present disclosure, disposing the heat dissipation layer on the non-display side of the display panel comprises: sequentially forming an adhesive layer, a buffer layer, and a heat dissipation film on the non-display side of the display panel.

For example, in the manufacturing method provided by at least an embodiment of the present disclosure, the driving circuit arranging region comprises a first portion and a second portion that are insulated from each other, the second portion is adhered to a portion of the display panel that is bent to the non-display side by an adhesive, and the chip on film is bonded to the display panel.

For example, in the manufacturing method provided by at least an embodiment of the present disclosure, forming the heat dissipation layer comprises: providing a buffer layer; providing a heat dissipation film on the buffer layer; and processing the heat dissipation film, to allow the heat dissipation film to form a first heat dissipation portion corresponding to the driving circuit arranging region and a second heat dissipation portion corresponding to the peripheral region.

For example, in the manufacturing method provided by at least an embodiment of the present disclosure, processing the heat dissipation film comprises: cutting the heat dissipation film by a mechanical cutting method or a laser cutting method to remove a part of a material of the heat dissipation film, to form the first heat dissipation portion corresponding to the driving circuit arranging region and the second heat dissipation portion corresponding to the peripheral region.

For example, the manufacturing method provided by at least an embodiment of the present disclosure further comprises: forming an adhesive layer on a side of the buffer layer away from the heat dissipation film. Disposing the heat dissipation layer on the non-display side of the display panel comprises: connecting the buffer layer on which the heat dissipation film is formed to the display panel through the adhesive layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
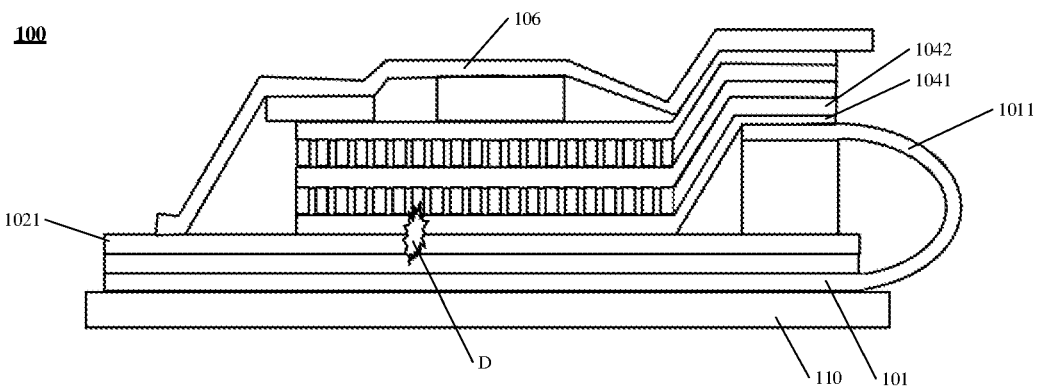
FIG. 1 is a schematic diagram of a display device.

FIG. 1 is a schematic diagram of a display device. As shown in FIG. 1, the display device 100 includes a display panel 101 having flexibility, a transparent cover plate 110 located on a display side (a lower side of the display panel 101 as shown in the figure) of the display panel 101, a heat dissipation film 1021 on a non-display side (an upper side of the display panel 101 as shown in the figure) of the display panel 101, and other structures. The heat dissipation film 1021 is generally formed on the entire surface of the non-display side of the display panel 101, and a material of the heat dissipation film 1021 is generally conductive. For example, the non-display side of the display panel 101 is further provided with a circuit structure 1042, etc. The circuit structure 1042 is generally electrically connected to a portion 1011, bent to the non-display side, of the display panel 101, thereby transmitting signals for the display panel 101. For example, the circuit structure 1042 is disposed on an insulating layer 1041 and is insulated from the heat dissipation film 1021 through the insulating layer 1041.

During a process of manufacturing or using the display device, the insulating layer 1041 may be damaged, for example, a region indicated by reference numeral D in FIG. 1 is damaged. In this case, the circuit structure 1042 on the insulating layer 1041 may be electrically connected to the heat dissipation film 1021 through the damaged D region, and be grounded through the heat dissipation film 1021 and a protective layer 106 thereon, thereby causing the circuit structure 1042 to be short-circuited and affecting signal transmission.

At least an embodiment of the present disclosure provides a display device, comprising: a display panel, a heat dissipation layer, and a chip on film. The heat dissipation layer is on a non-display side of the display panel and comprises a driving circuit arranging region and a peripheral region, the heat dissipation layer located in at least a part of the driving circuit arranging region is insulated from the heat dissipation layer located in the peripheral region; and the chip on film is on a side of the heat dissipation layer away from the display panel, and is in the driving circuit arranging region.

At least an embodiment of the present disclosure provides a manufacturing method for manufacturing a display device, comprising: providing a display panel; disposing a heat dissipation layer on a non-display side of the display panel, the heat dissipation layer comprising a driving circuit arranging region and a peripheral region, and the heat dissipation layer located in at least a part of the driving circuit arranging region being insulated from the heat dissipation layer located in the peripheral region; and disposing a chip on film on the driving circuit arranging region.

The display device and the manufacturing method thereof provided by the present disclosure are described below through several specific embodiments.

Figure 2A:
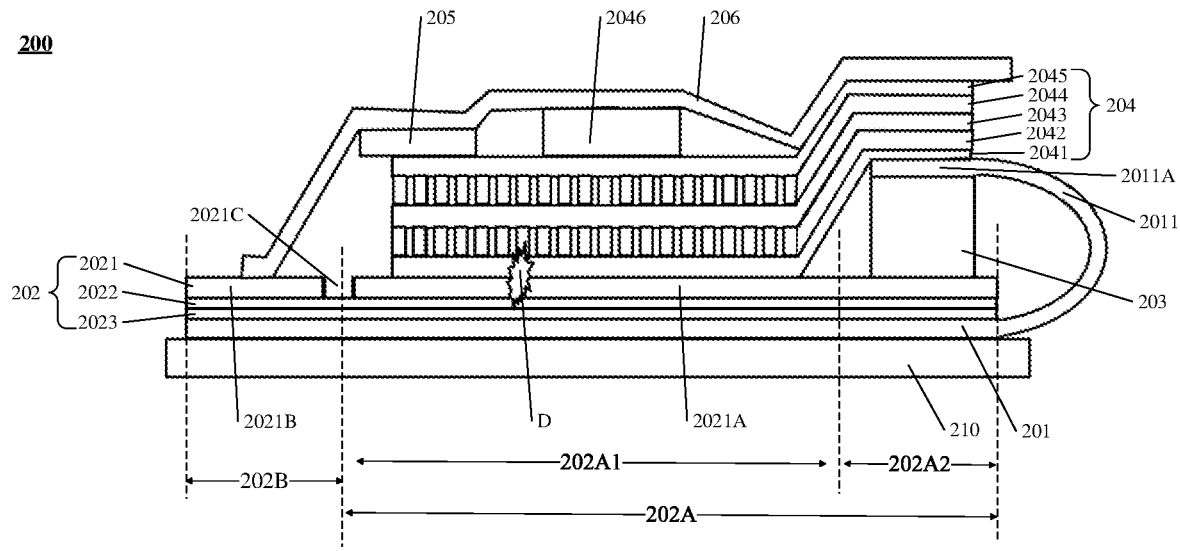
FIG. 2A is a schematic cross-sectional diagram of a display device provided by some embodiments of the present disclosure.
Figure 3:
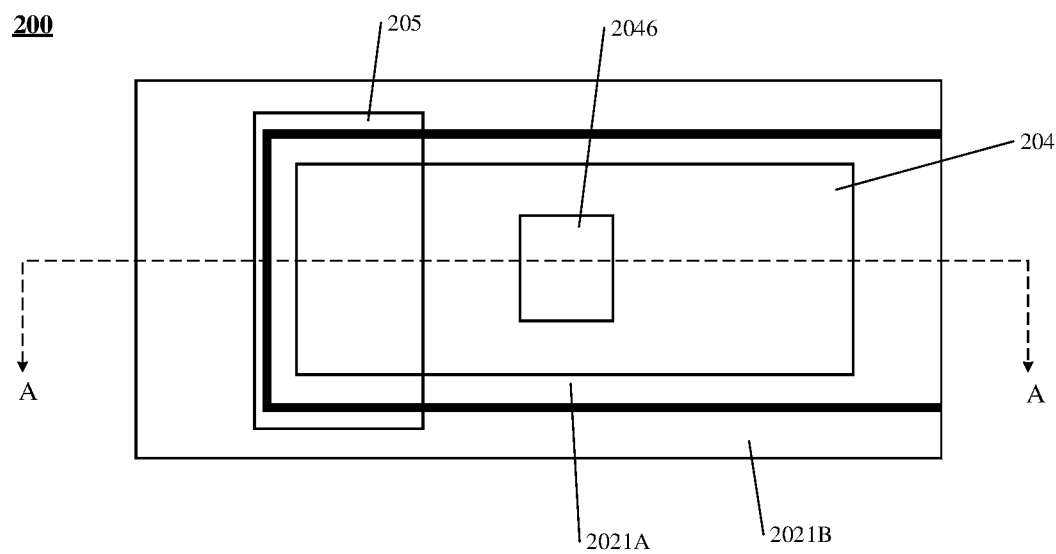
FIG. 3 is a schematic plane diagram of a display device provided by some embodiments of the present disclosure.

At least one embodiment of the present disclosure provides a display device. FIG. 2A shows a schematic cross-sectional diagram of the display device, FIG. 3 is a schematic plane schematic of the display device, and FIG. 2A shows a schematic cross-sectional diagram of the display device shown in FIG. 3 along the A-A line.

As shown in FIG. 2A, the display device 200 includes a display panel 201, a heat dissipation layer 202, a chip on film (COF) 204, and other structures. The heat dissipation layer 202 is disposed on a non-display side of the display panel 201 (an upper side of the display panel 201 as shown in the figure), and includes a driving circuit arranging region 202A and a peripheral region 202B, the heat dissipation layer 202 located in at least a part of the driving circuit arranging region 202A is insulated from the heat dissipation layer 202 located in the peripheral region 202B. For example, in the display device shown in FIGS. 2A and 3, the heat dissipation layer 202 located in the driving circuit arranging region 202A is entirely insulated from the heat dissipation layer 202 located in the peripheral region 202B. The chip on film 204 is disposed on a side of the heat dissipation layer 202 away from the display panel 201, and is disposed in the driving circuit arranging region 202A, in this case, an orthographic projection of the chip on film 204 on the heat dissipation layer 202 falls within the driving circuit arranging region 202A of the heat dissipation layer 202.

For example, in this embodiment, the driving circuit arranging region 202A includes a first portion 202A1 that is in direct contact with the chip on film 204 and a second portion 202A2 that is not in direct contact with the chip on film 204.

For example, the display panel 201 has flexibility, and a portion 2011 of the display panel 201 bent to the non-display side is fixed to the second portion 202A2. For example, the portion 2011 of the display panel 201 bent to the non-display side includes a bonding region 2011A, and the chip on film 204 is connected to the bonding region 2011A, on the non-display side, of the display panel 201. The bonding region 2011A includes, for example, wires connected to a structure such as a driving circuit in a display region of the display panel 201. For example, the second portion is adhered to the portion 2011 of the display panel 201 that is bent to the non-display side by the adhesive 203, and above the second portion 202A2, the chip on film 204 is bonded to the bonding region, bent to the non-display side, of the display panel 201. In the above case, the chip on film 204 is bonded to the display panel 201 on the non-display side of the display panel 201, so that the size of a non-display region, on the display side, of the display panel 201 can be reduced, which is beneficial to the large screen design of the display panel 201.

Figure 2B:
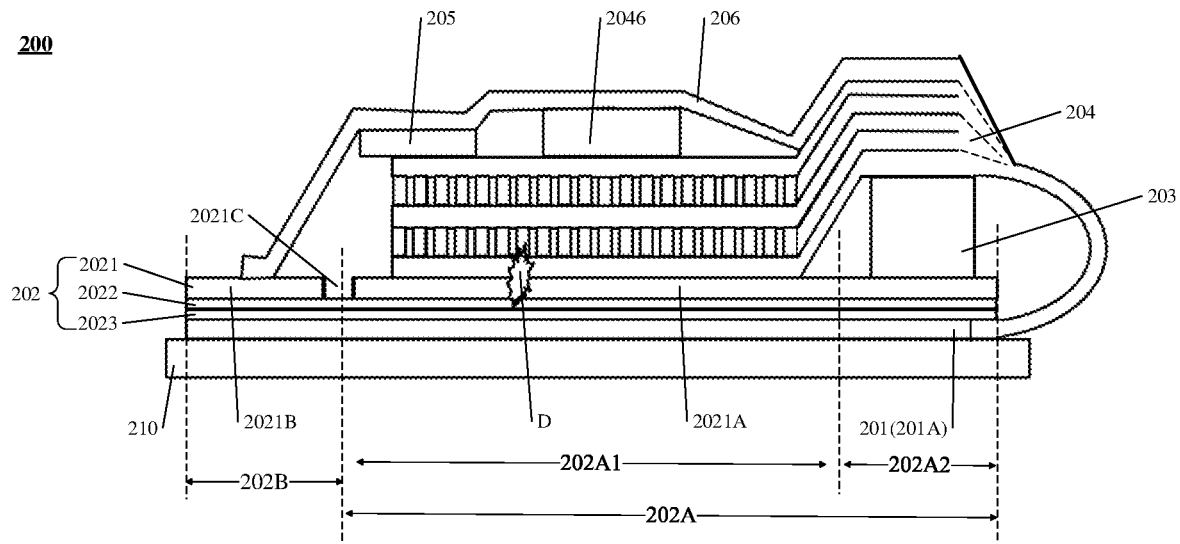
FIG. 2B is a schematic cross-sectional diagram of another display device provided by some embodiments of the present disclosure.
Figure 2C:
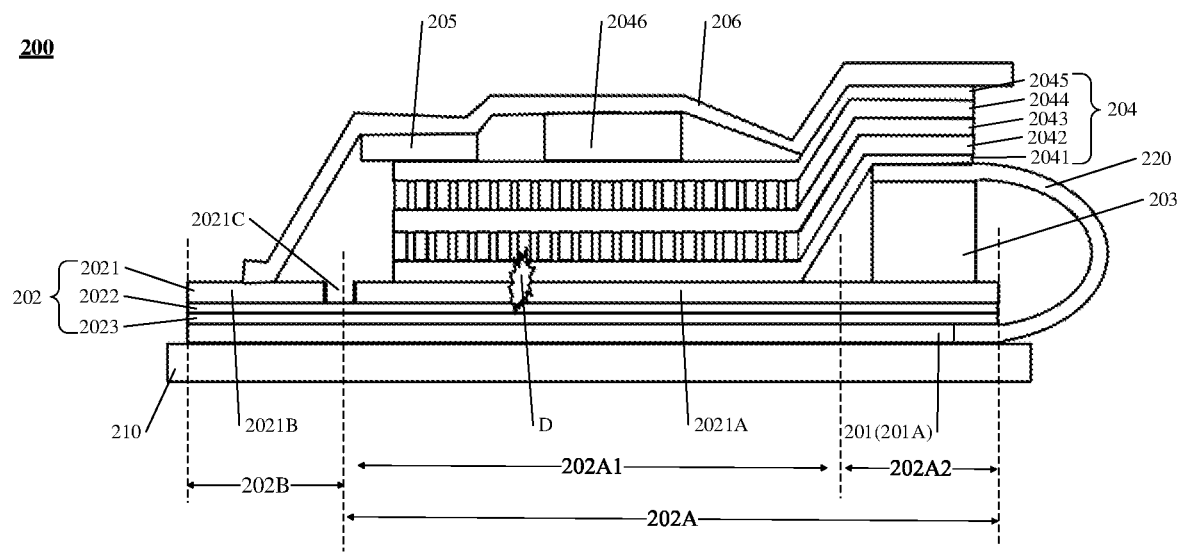
FIG. 2C is a schematic cross-sectional diagram of still another display device provided by some embodiments of the present disclosure.

For example, in other examples, as shown in FIG. 2B, the chip on film 204 may extend to the display side of the display panel 201 and be connected to the bonding region 201A of the display panel 201 for bonding, for clarity, the bent portion of the chip on film 204 is simplified in the figure. For example, in other examples, as shown in FIG. 2C, the display device 201 further includes a first flexible circuit board 220, the first flexible circuit board 220 is connected to the bonding region 201A of the display panel 201 on the display side of the display panel 201 and extends to the non-display side of the display panel 201, in this case, the first flexible circuit board 220 is fixed to the second portion 202A2, and the chip on film 204 is bonded to the first flexible circuit board 220 on the second portion 202A2.

For example, as shown in FIG. 2A, the chip on film 204 includes a first insulating layer 2041, a first signal line layer 2042 disposed on the first insulating layer 2041, a second insulating layer 2043 disposed on the first signal line layer 2042, a second signal line layer 2044 disposed on the second insulating layer 2043, and a third insulating layer 2045 disposed on the second signal line layer 2044, and the like. For example, a first signal line in the first signal line layer 2042 and a second signal line in the second signal line layer 2044 are electrically connected to the driving circuit in the display panel 201 (for example, the first signal line and the second signal line extend to the second portion 202A2 and are bonded on the second portion 202A2), the driving circuit is, for example, used to drive pixel units, which can emit light of different colors, of the display panel 201, so that the first signal line in the first signal line layer 2042 and the second signal line in the second signal line layer 2044 can transmit driving signals for the pixel units that emit light of different colors, respectively.

For example, the chip on film 204 further includes a driving circuit board (driver IC) 2046 disposed on the third insulating layer 2045. For example, the driving circuit board 2046 is connected with the first signal line in the first signal line layer 2042 and the second signal line in the second signal line layer 2044 through holes in the second insulating layer 2043 and the third insulating layer 2045, respectively, so that the driving circuit board 2046 can provide driving signals to the pixel units in the display panel 201 through the first signal line and the second signal line, so as to control light emitting states of the pixel units that can emit light of different colors, respectively.

For example, the display device 200 provided in this embodiment further includes a second flexible printed circuit (FPC) 205, and the second flexible circuit board 205 is disposed on a side of the chip on film 204 away from the display panel 201. For example, the second flexible circuit board 205 includes a control circuit that controls a touch function and the like of the display panel. For example, the first signal line layer 2042 further includes a third signal line connected to a touch circuit of the display panel, and/or the second signal line layer 2044 further includes a fourth signal line connected to the touch circuit of the display panel. In this case, the second flexible circuit board 205 may be electrically connected to the third signal line and/or the fourth signal line to provide driving signals for the touch circuit of the display panel.

For example, in this embodiment, as shown in FIG. 2A, the heat dissipation layer 202 includes a heat dissipation film 2021 and a buffer layer 2022. The heat dissipation film 2021 includes a first heat dissipation portion 2021A disposed in the driving circuit arranging region 202A and a second heat dissipation portion 2021B disposed in the peripheral region 202B. For example, the first heat dissipation portion 2021A and the second heat dissipation portion 2021B are insulated. For example, the second heat dissipation portion 2021B is grounded, for example, is grounded through a protective layer 206 (described later) provided thereon. The buffer layer 2022 is disposed on a side of the heat dissipation film 2021 close to the display panel 201, and may be continuously disposed. The first heat dissipation portion 2021A and the second heat dissipation portion 2021B of the heat radiation film 2021 are both on the buffer layer 2022. In this embodiment, the buffer layer 2022 can buffer the stress of the heat dissipation film 2021 during a manufacturing or using process, so as to prevent the heat dissipation film 2021 from being damaged.

For example, in this embodiment, the heat dissipation layer 202 further includes an adhesive layer 2023. The adhesive layer 2023 is disposed on a side of the buffer layer 2022 close to the display panel 201, and may be continuously disposed. The entire buffer layer 2022 is on the adhesive layer 2023. For example, the buffer layer 2022 and the heat dissipation film 2021 thereon are connected to the non-display side of the display panel 201 through the adhesive layer 2023.

For example, in this embodiment, the material of the heat dissipation film 2021 is metal. The metal material usually has a good heat dissipation effect and ductility. For example, the metal includes copper, copper alloy, silver, silver alloy, aluminum or aluminum alloy, and the like. For example, in one example, the heat dissipation film 2021 may be a copper foil. For example, in this embodiment, the material of the buffer layer 2022 includes a polymer material such as an acrylic polymer, and the material of the adhesive layer 2023 includes an organic material having adhesiveness such as a resin, and the embodiments of the present disclosure are not specifically limited thereto.

For example, the display device 200 provided in this embodiment further includes a protective layer 206, and the protective layer 206 covers the chip on film 204. For example, the protective layer 206 also covers structures such as the second flexible circuit board 205, so as to provide encapsulation and protection for the chip on film 204, the second flexible circuit board 205, and the like. For example, the protective layer 206 includes a portion covering the peripheral region 2021B of the heat dissipation film 2021, thereby preventing impurities such as water and oxygen from entering into the chip on film 204, the second flexible circuit board 205, and the like from the peripheral region 2021B. For example, the material of the protective layer 206 includes an organic material such as polyethylene terephthalate (PET) or other suitable materials such as copper foil and graphite, and the protective layer 306 can protect the chip on film 304 and the like and dissipate heat from the chip on film 304 and the like.

For example, in this embodiment, the first heat dissipation portion 2021A and the second heat dissipation portion 2021B of the heat dissipation film 2021 are disposed in the same layer, and therefore the first heat dissipation portion 2021A and the second heat dissipation portion 2021B can be formed by cutting the same film layer during the manufacturing process. For example, there is a gap 2021C between the first heat dissipation portion 2021A and the second heat dissipation portion 2021B. For example, in some examples of this embodiment, the gap 2021C between the first heat dissipation portion 2021A and the second heat dissipation portion 2021B includes an insulation material to insulate the first heat dissipation portion 2021A from the second heat dissipation portion 2021B. For example, the insulation material includes an inorganic insulation material such as silicon oxide and silicon nitride or an organic insulation material such as polyimide, which is not limited in the embodiments of the present disclosure.

Exemplarily, the gap 2021C may be formed in the driving circuit arranging region 202A, may be formed in the peripheral region 202B, or a part of the gap 2021C may be formed in the driving circuit arranging region 202A, and the other part of the gap 2021C may be formed in the peripheral region 202B. Alternatively, the gap 2021C may be a separate part outside the driving circuit arranging region 202A and the peripheral region 202B, and the embodiments of the present disclosure are not limited in this aspect.

Exemplarily, the buffer layer 2022 and the adhesive layer 2023 may be continuously disposed in the driving circuit arranging region 202A and the peripheral region 202B (in a case where the gap 2021C is regarded as a part of the driving circuit arranging region 202A, or regarded as a part of the peripheral region 202B, or regarded as both a part of the driving circuit arranging region 202A and a part of the peripheral region 202B), alternatively, the buffer layer 2022 and the adhesive layer 2023 may be continuously disposed in the driving circuit arranging region 202A, the peripheral region 202B, and the region corresponding to the gap 2021C.

For example, in this embodiment, a transparent cover plate 210 is disposed on the display side of the display panel 201 (a lower side of the display panel 201 as shown in the figure), and the transparent cover plate 210 is used to protect a surface of the display side of the display panel 201. For example, the material of the transparent cover plate 210 may be an inorganic material such as glass or an organic material such as polyimide, and the embodiments of the present disclosure are not limited in this aspect.

In this embodiment, the second heat dissipation portion 2021B, disposed in the peripheral region 202B, of the heat dissipation film 2021 is grounded (GND) through the protective layer 206 covering the second heat dissipation portion 2021B. By cutting the heat dissipation film 2021 into the first heat dissipation portion 2021A and the second heat dissipation portion 2021B that are insulated from each other, in a case where the first insulating layer 2041, which is in direct contact with the heat dissipation film 2021, of the chip on film 204 is damaged, for example, is damaged at the D position, the signal lines in the first signal line layer 2042 on the first insulating layer 2041 are not grounded through the second heat dissipation portion 2021B of the heat dissipation film 2021 and the protective layer 206, so that signal lines can be prevented from being short-circuited and the reliability of the display device can be improved.

Figure 4:
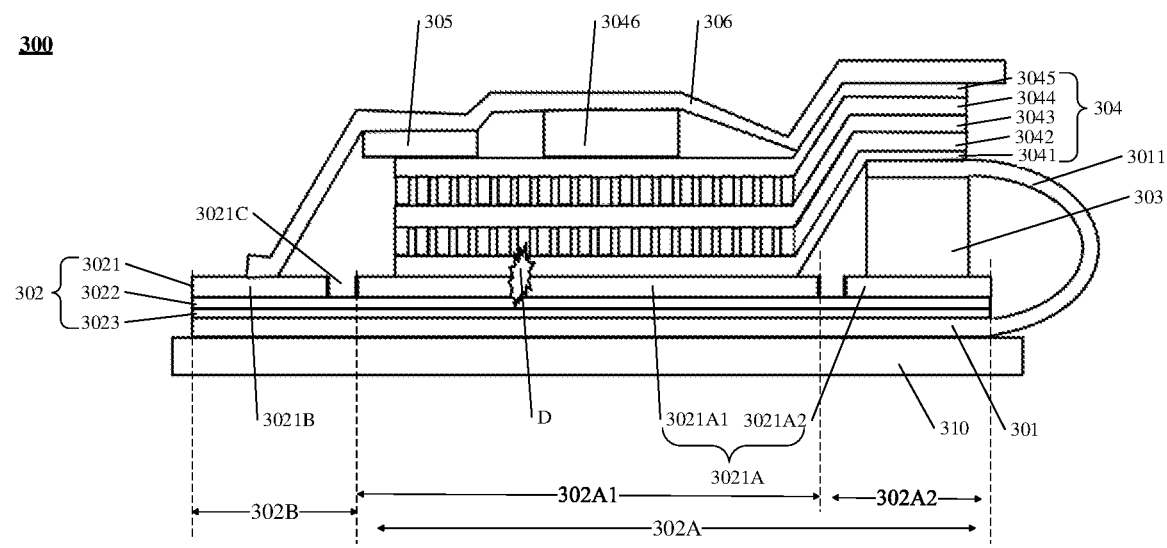
FIG. 4 is a schematic cross-sectional diagram of yet another display device provided by some embodiments of the present disclosure.
Figure 5:
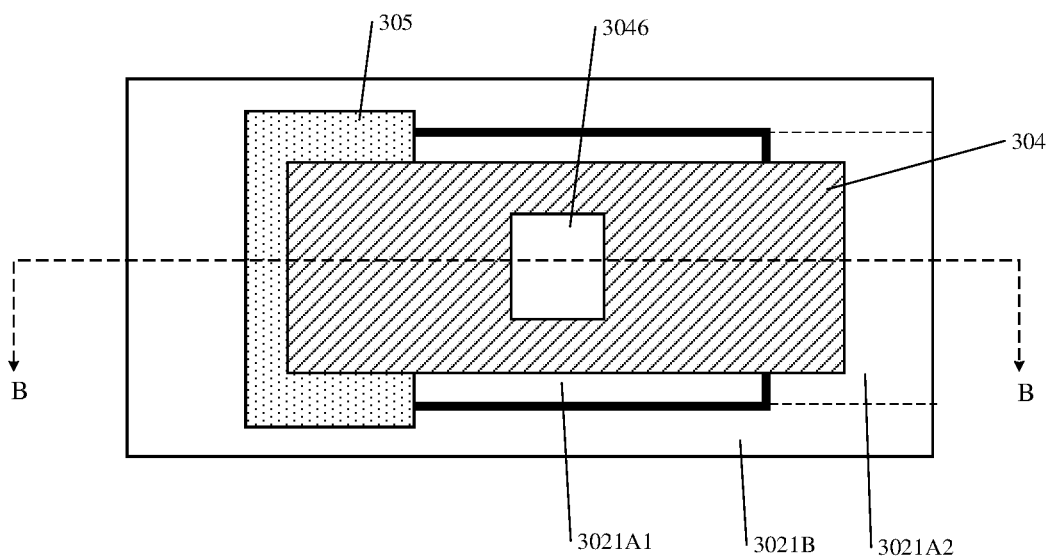
FIG. 5 is a schematic plane diagram of another display device provided by some embodiments of the present disclosure.

At least one embodiment of the present disclosure provides a display device. FIG. 4 shows a schematic cross-sectional diagram of the display device, FIG. 5 shows a schematic plane diagram of the display device, and FIG. 4 is a schematic cross-sectional diagram of the display device shown in FIG. 5 along a line B-B.

As shown in FIG. 4, the display device 300 includes a display panel 301, a heat dissipation layer 302, and a chip on film 304, and other structures. The heat dissipation layer 302 is disposed on a non-display side of the display panel 301 (an upper side of the display panel 301 as shown in the figure), and includes a driving circuit arranging region 302A and a peripheral region 302B, the heat dissipation layer 302 located in at least a part of the driving circuit arranging region 302A is insulated from the heat dissipation layer 302 located in the peripheral region 302B. For example, in the display device shown in FIGS. 4 and 5, the driving circuit arranging region 302A includes a first portion 302A1 and a second portion 302A2, the heat dissipation layer 302 located in the first portion 302A1 is insulated from the heat dissipation layer 302 located in the peripheral region 302B, and the heat dissipation layer 302 located in the second portion 302A2 is connected with the heat dissipation layer 302 located in the peripheral region 302B. The chip on film 304 is disposed on a side of the heat dissipation layer 302 away from the display panel 301, is disposed in the driving circuit arranging region 302A, and is in direct contact with the heat dissipation layer 302 on the first portion 302A1 insulated from the peripheral region 302B. The chip on film 304 is spaced apart from the heat dissipation layer 302 on the second portion 302A2.

For example, as shown in FIG. 4, the heat dissipation layer 302 includes a heat dissipation film 3021 and a buffer layer 3022. The heat dissipation film 302 includes a first heat dissipation portion 3021A disposed in the driving circuit arranging region 302A and a second heat dissipation portion 3021B disposed in the peripheral region 302B. The first heat dissipation portion 3021A further includes a third heat dissipation portion 3021A1 disposed in the first portion 302A1 of the driving circuit arranging region 302A and a fourth heat dissipation portion 3021A2 disposed in the second portion 302A2 of the driving circuit arranging region 302A. The third heat dissipation portion 3021A1 and the fourth heat dissipation portion 3021A2 are insulated from each other, and the fourth heat dissipation portion 3021A2 is connected with the second heat dissipation portion 3021B, for example, the fourth heat dissipation portion 3021A2 and the second heat dissipation portion 3021B are integrally formed as a whole. For example, the buffer layer 3022 is disposed on a side of the heat dissipation film 3021 close to the display panel 301 and may be continuously disposed. Both the first heat dissipation portion 3021A and the second heat dissipation portion 3021B of the heat dissipation film 3021 are on the buffer layer 3022. In this embodiment, the buffer layer 3022 can buffer the stress of the heat dissipation film 3021 during a manufacturing or using process, so as to prevent the heat dissipation film 3021 from being damaged.

In this embodiment, the third heat dissipation portion 3021A1, disposed in the first portion 302A1 of the driving circuit arranging region 302A, of the heat dissipation film 302 is in direct contact with the chip on film 304, and the fourth heat dissipation portion 3021A2, disposed in the second portion 302A2 of the driving circuit arranging region 302A, of the heat dissipation film 302 is not in direct contact with the chip on film 304, for example, is spaced apart from the chip on film 304 by an adhesive 303.

For example, the display panel 301 has flexibility, and the fourth heat dissipation portion 3021A2 is used for fixing to the portion 3011, which is bent to the non-display side of the display panel 301, of the display panel 301. For example, the portion 3011 of the display panel 301 bent to the non-display side is fixed to, for example, adhered to, the second portion 302A2. For example, the portion 3011 of the display panel 301 bent to the non-display side includes a bonding region, and the chip on film 304 is connected to the bonding region, on the non-display side, of the display panel 201. The bonding region includes, for example, wires connected a structure such as a driving circuit in a display region of the display panel 301. For example, the fourth heat dissipation portion 3021A2 is adhered to the portion 3011, which is bent to the non-display side, of the display panel 301 through the adhesive 303, and above the fourth heat dissipation portion 3021A2, the chip on film 304 is bonded to the portion 3011, bent to the non-display side, of the display panel 301. In the above case, the chip on film 304 is bonded to the display panel 301 on the non-display side of the display panel 301, so that the size of a non-display region, on the display side, of the display panel 201 can be reduced, which is beneficial to the large screen design of the display panel 301.

For example, in other examples, the chip on film 304 may extend to the display side of the display panel 301 and be connected to the bonding region of the display panel 201 for bonding. For example, in some other examples, the display device 301 further includes a first flexible circuit board, the first flexible circuit board is connected to the bonding region of the display panel 301 on the display side of the display panel 301 and extends to the non-display side of the display panel 301, in this case, the first flexible circuit board is fixed to the second portion 202A2. For details, reference may be made to the above embodiments and FIGS. 2B and 2C.

For example, in other examples, the chip on film 304 may extend to the display side of the display panel 301 and be connected to the bonding region, for bonding, of the display panel 301. The fourth heat dissipation portion 3021A2 can be used for fixing to the chip on film 304. For example, in other examples, the display device 301 further includes a first flexible circuit board. The first flexible circuit board is connected to the bonding region of the display panel 301 on the display side of the display panel 301 and extends to the non-display side of the display panel 301. In this case, the first flexible circuit board may be fixed to, for example, adhered to, the second portion 302A2.

For example, as shown in FIG. 4, the chip on film 304 includes a first insulating layer 3041, a first signal line layer 3042 disposed on the first insulating layer 3041, a second insulating layer 3043 disposed on the first signal line layer 3042, a second signal line layer 3044 disposed on the second insulation layer 3043, a third insulating layer 3045 disposed on the second signal line layer 3044, and the like. For example, a first signal line in the first signal line layer 3042 and a second signal line in the second signal line layer 3044 are electrically connected to a driving circuit in the display panel 301, the driving circuit is, for example, used to drive pixel units that can emit light of different colors, so that the first signal line in the first signal line layer 3042 and the second signal line in the second signal line layer 3044 can transmit driving signals for the pixel units that emit light of different colors, respectively, thereby controlling light emitting states of the pixel units that can emit light of different colors, respectively.

For example, the chip on film 304 further includes a driving circuit board (driver IC) 3046 disposed on the third insulating layer 3045. For example, the driving circuit board 3046 is connected with the first signal line in the first signal line layer 3042 and the second signal line in the second signal line layer 3044 through holes in the second insulating layer 3043 and the third insulating layer 3045, respectively, so that the driving circuit board 3046 can provide driving signals to the pixel units in the display panel 301 through the first signal line and the second signal line.

For example, the display device 300 provided in this embodiment further includes a second flexible printed circuit (FPC) 305, and the second flexible circuit board 305 is disposed on a side of the chip on film 304 away from the display panel 301. For example, the second flexible circuit board 305 includes a control circuit that controls a touch function and the like of the display panel. For example, the first signal line layer 3042 further includes a third signal line connected to a touch circuit of the display panel, and/or the second signal line layer 3044 further includes a fourth signal line connected to the touch circuit of the display panel. In this case, the second flexible circuit board 305 may be electrically connected to the third signal line and/or the fourth signal line to provide driving signals for the touch circuit of the display panel.

In this embodiment, because the second portion of the driving circuit arranging region 302A is not in direct contact with the chip on film 304, and an adhesive 303 is between the second portion of the driving circuit arranging region 302A and the chip on film 304, in a case where a portion of the first insulating layer 3041 located on the second portion of the driving circuit arranging region 302A is damaged, the signal lines in the first signal line layer 3042 will not directly contact the fourth heat dissipation portion 3021A2 of the heat dissipation film 3021 to form an electrical connection. In this case, the fourth heat dissipation portion 3021A2 may be connected to the second heat dissipation portion 3021B disposed in the peripheral region 302B, for example, the fourth heat dissipation portion 3021A2 and the second heat dissipation portion 3021B are integrally formed as a whole, provided that the third heat dissipation portion 3021A1 that is in direct contact with the chip on film 304 is insulated from the fourth heat dissipation portion 3021A2 and the second heat dissipation portion 3021B that are not in direct contact with the chip on film 304.

For example, in this embodiment, the heat dissipation layer 302 further includes an adhesive layer 3023. The adhesive layer 3023 is disposed on a side of the buffer layer 3022 close to the display panel 301, and may be continuously disposed. The entire buffer layer 3022 is on the adhesive layer 3023. For example, the buffer layer 3022 and the heat dissipation film 3021 thereon are adhered to the non-display side of the display panel 301 through the adhesive layer 3023.

For example, in this embodiment, the material of the heat dissipation film 3021 is metal. The metal material usually has a good heat dissipation effect and ductility. For example, the metal includes copper, copper alloy, silver, silver alloy, aluminum or aluminum alloy, and the like. For example, in one example, the heat dissipation film 3021 may be a copper foil. For example, in this embodiment, the material of the buffer layer 3022 includes a polymer material such as an acrylic polymer, and the material of the adhesive layer 3023 includes an organic material having adhesiveness such as a resin, and the embodiments of the present disclosure are not specifically limited in this aspect.

For example, the display device 300 provided in this embodiment further includes a protective layer 306, and the protective layer 306 covers the chip on film 304. For example, the protective layer 306 also covers structures such as the second flexible circuit board 305, so as to provide encapsulation and protection for the chip on film 304, the second flexible circuit board 305, and the like. For example, the protective layer 306 includes a portion covering the peripheral region 3021B of the heat dissipation film 3021, thereby preventing impurities such as water and oxygen from entering into the chip on film 304, the second flexible circuit board 305, and the like from the peripheral region 3021B. For example, the material of the protective layer 306 includes an organic material such as polyethylene terephthalate (PET) or other suitable materials such as copper foil and graphite, and the protective layer 306 can protect the chip on film 304 and the like and dissipate heat from the chip on film 304 and the like.

For example, in this embodiment, the plurality of heat dissipation portions of the heat dissipation film 3021 are disposed in the same layer, and therefore the plurality of heat dissipation portions can be formed by cutting the same film layer during the manufacturing process. For example, there is a gap 3021C between the third heat dissipation portion 3021A and the second heat dissipation portion 3021B as well as the fourth heat dissipation portion 3021B that is connected to the second heat dissipation portion 3021B. For example, in some examples of this embodiment, the gap 2021C includes an insulation material to insulate the third heat dissipation portion 3021A from the second heat dissipation portion 3021B as well as the fourth heat dissipation portion 3021B that is connected to the second heat dissipation portion 3021B. For example, the insulation material includes an inorganic insulation material such as silicon oxide and silicon nitride or an organic insulation material such as polyimide, which is not limited in the embodiments of the present disclosure.

Exemplarily, the gap 3021C may be formed in the driving circuit arranging region 302A, may be formed in the peripheral region 302B, or a part of the gap 3021C may be formed in the driving circuit arranging region 302A, and the other part of the gap 3021C may be formed in the peripheral region 302B. Alternatively, the gap 2021C may be a separate part outside the driving circuit arranging region 302A and the peripheral region 302B, and the embodiments of the present disclosure are not limited in this aspect.

Exemplarily, the buffer layer 3022 and the adhesive layer 3023 may be continuously disposed in the driving circuit arranging region 302A and the peripheral region 302B (in a case where the gap 3021C is regarded as a part of the driving circuit arranging region 302A, or regarded as a part of the peripheral region 302B, or regarded as both a part of the driving circuit arranging region 302A and a part of the peripheral region 302B), alternatively, the buffer layer 3022 and the adhesive layer 3023 may be continuously provided in the driving circuit arranging region 302A, the peripheral region 302B, and the region corresponding to the gap 3021C.

For example, in this embodiment, a transparent cover plate 310 is disposed on the display side of the display panel 301 (a lower side of the display panel 301 as shown in the figure), and the transparent cover plate 310 is used to protect a surface of the display side of the display panel 301. For example, the material of the transparent cover plate 310 may be an inorganic material such as glass or an organic material such as polyimide, and the embodiments of the present disclosure are not limited in this aspect.

In this embodiment, by cutting the heat dissipation film 3021 into a plurality of portions, in a case where the first insulating layer 3041, which is in direct contact with the heat dissipation film 3021, of the chip on film 304 is damaged, for example, is damaged at the D position, the signal lines in the first signal line layer 3042 on the first insulating layer 3041 are not grounded through the second heat dissipation portion 3021B of the heat dissipation film 3021 and the protective layer 306, so that the signal lines can be prevented from being short-circuited and the reliability of the display device can be improved.

Figure 6:
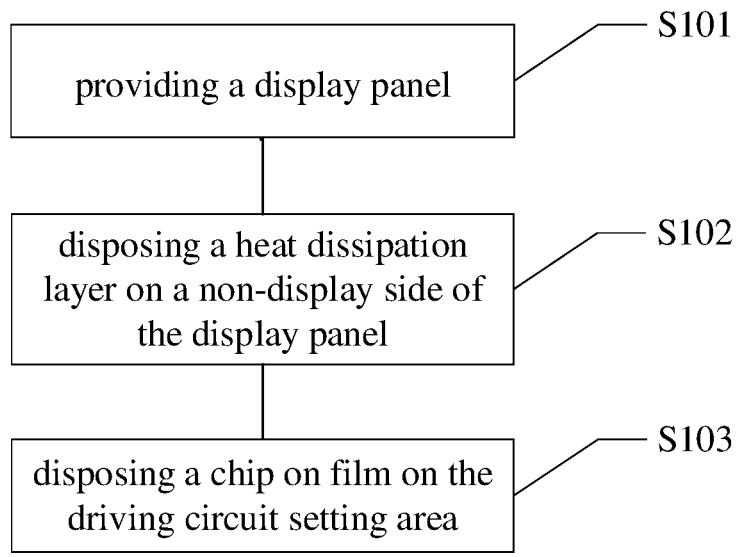
FIG. 6 is a flowchart of a manufacturing method of a display device provided by some embodiments of the present disclosure.

At least one embodiment of the present disclosure provides a manufacturing method for manufacturing a display device. As shown in FIG. 6, the manufacturing method includes steps S101-S103.

Step S101: providing a display panel.

In this embodiment, the display panel is, for example, a flexible organic light emitting display panel (OLED). For example, the flexible organic light emitting display panel includes a plurality of pixel units, which can emit light of different colors, formed on a flexible substrate and a driving circuit that drives the pixel units to emit light. For example, the driving circuit includes components such as a thin film transistor and a capacitor, and may be formed in various forms such as 2T1C, 3T1C, and the embodiment of the present disclosure are not limited thereto.

Step S102: disposing a heat dissipation layer on a non-display side of the display panel.

For example, disposing the heat dissipation layer on the non-display side of the display panel includes: forming the heat dissipation layer, in which the heat dissipation layer comprises the driving circuit arranging region and the peripheral region, and the driving circuit arranging region and the peripheral region are at least partially insulated from each other; and connecting the heat dissipation layer to the non-display side of the display panel.

Figure 7:
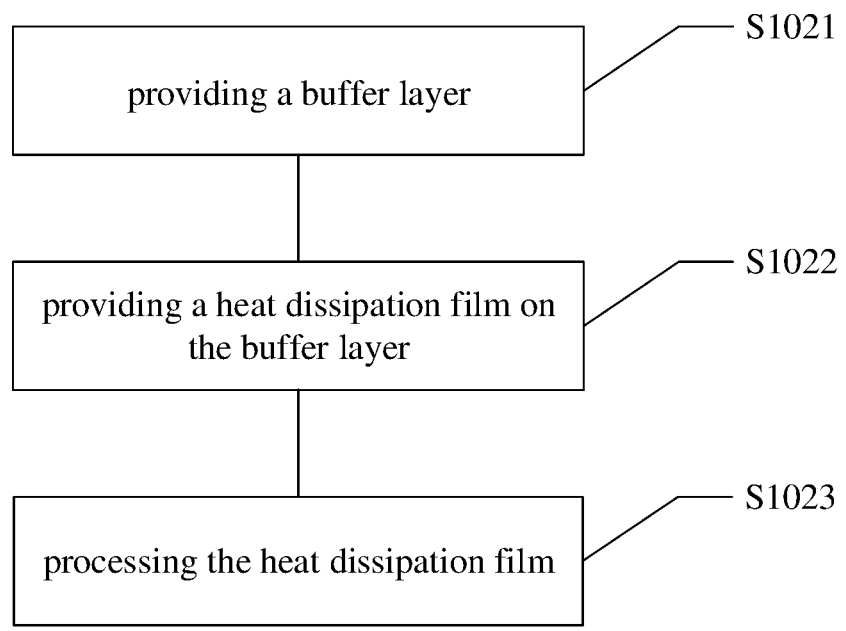
FIG. 7 is a flowchart of a method for manufacturing a heat dissipation film in a display device provided by some embodiments of the present disclosure.

In this embodiment, the heat dissipation layer includes, for example, a heat dissipation film and a buffer layer. For example, as shown in FIG. 7, forming the heat dissipation layer includes steps S1021-S1023.

Step S1021: providing a buffer layer.

For example, in this embodiment, the material of the buffer layer includes a polymer material such as an acrylic polymer. For example, the entire buffer layer material is cut to the required size (a size to form one or more heat dissipation layers) for subsequent use.

Step S1022: providing a heat dissipation film on the buffer layer.

For example, in this embodiment, the material of the heat dissipation film is metal. The metal material usually has a good heat dissipation effect and ductility. For example, the metal includes copper, copper alloy, silver, silver alloy, aluminum or aluminum alloy, and the like. For example, in some examples, the heat dissipation film may be a copper foil.

For example, the entire heat dissipation film is attached to the buffer layer.

Step S1023: processing the heat dissipation film.

For example, processing the heat dissipation film comprises: cutting the heat dissipation film to form a first heat dissipation portion corresponding to the driving circuit arranging region and a second heat dissipation portion corresponding to the peripheral region.

For example, in this embodiment, the heat dissipation film may be cut by a mechanical cutting method or a laser cutting method to remove a part of the material of the heat dissipation film, to form the first heat dissipation portion corresponding to the driving circuit arranging region and the second heat dissipation portion corresponding to the peripheral region (for example, the heat dissipation film may be cut to form the form shown in FIG. 3 or FIG. 5).

For example, in some embodiments, a single process may be used to form a plurality of heat dissipation layers at the same time, in this case, the whole of the buffer layer and the heat dissipation film can be simultaneously cut by a mechanical cutting method or a laser cutting method to form a plurality of heat dissipation layers.

For example, an adhesive layer may be formed on a side of the buffer layer away from the heat dissipation film, and then the buffer layer on which the heat dissipation film is formed may be connected to the display panel through the adhesive layer. For example, the material of the adhesive layer includes an organic material having adhesiveness such as a resin.

For example, in some embodiments, the buffer layer and the heat dissipation film can also be formed directly on a large piece of adhesive layer, and then the whole of the adhesive layer, the buffer layer, and the heat dissipation film is cut to form a plurality of heat dissipation layers.

For example, in some embodiments, a heat dissipation layer may also be formed directly on the non-display side of the display panel, for example, an adhesive layer, a buffer layer, and a heat dissipation film are sequentially formed on the non-display side of the display panel, and the embodiments of the present disclosure are not specifically limited in this aspect.

In this embodiment, after the heat dissipation film is cut, there is a gap between the first heat dissipation portion and the second heat dissipation portion which are formed. For example, in some examples of this embodiment, an insulation material may be formed at the gap to insulate the first heat dissipation portion from the second heat dissipation portion. For example, the insulation material includes an inorganic insulation material such as silicon oxide and silicon nitride or an organic insulation material such as polyimide, and the embodiments of the present disclosure do not limit the insulation material.

Step S103: disposing a chip on film on the driving circuit arranging region.

In this embodiment, the chip on film includes, for example, a plurality of insulating layers and a plurality of signal line layers that are insulated by the insulating layers. The chip on film is disposed on the driving circuit arranging region through the insulating layer.

For example, before disposing the chip on film, a part of the display panel may be bent to the non-display side of the display panel and be connected to the driving circuit arranging region of the heat dissipation layer through an adhesive. Then, the chip on film is disposed on the driving circuit arranging region, and the chip on film and the portion, which is bent to the non-display side, of the display panel are bonded.

For example, a protective layer may be formed to cover the structures such as the chip on film, the circuit board on the chip on film, and the like, thereby providing encapsulation and protection for the structures such as the chip on film, the circuit board and the like. For example, the protective layer includes a portion covering the peripheral region of the heat dissipation film, thereby preventing impurities such as water and oxygen from entering into the chip on film, the circuit board and the like from the peripheral region. For example, the material of the protective layer includes an organic material such as polyethylene terephthalate (PET) or other suitable materials such as copper foil and graphite, and the embodiments of the present disclosure are not limited thereto.

It should be noted that other necessary structures such as a transparent cover plate and the like may also be formed in the display device, these structures can be formed by conventional methods, and the embodiments of the present disclosure are not limit in this aspect.

In the manufacturing method provided in this embodiment, by dividing the heat dissipation film of the heat dissipation layer into a plurality of portions that are insulated from each other, in a case where the insulating layer, which is in direct contact with the heat dissipation film, of the chip on film is damaged, the signal lines on the insulating layer are not grounded through the heat dissipation film and the protective layer, so that the signal lines can be prevented from being short-circuited and the reliability of the display device can be improved.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or region may be enlarged or narrowed, that is, the drawings are not drawn in a real scale. However, it should be understood that, in the case a component or element such as a layer, a film, a region, a substrate, or the like is referred to be "on" or "under" another component or element, the component or element may be "directly" "on" or "under" the another component or element, or a component or element may be interposed therebetween.

(3) In case of no conflict, features the embodiments of the present disclosure and features in the embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display device, comprising:
    a display panel,
    a heat dissipation layer, on a non-display side of the display panel and comprising a driving circuit arranging region and a peripheral region, wherein the heat dissipation layer located in at least a part of the driving circuit arranging region is insulated from the heat dissipation layer located in the peripheral region; and
    a chip on film, on a side of the heat dissipation layer away from the display panel and in the driving circuit arranging region.

2. The display device according to claim 1, wherein the driving circuit arranging region comprises a first portion and a second portion that are insulated from each other, the heat dissipation layer located in the first portion is insulated from the heat dissipation layer located in the peripheral region, and the heat dissipation layer located in the second portion is connected to the heat dissipation layer located in the peripheral region; and
    the chip on film is in contact with the heat dissipation layer located in the first portion, and the chip on film is spaced apart from the heat dissipation layer located in the second portion.

3. The display device according to claim 2, wherein a portion, bent to the non-display side, of the display panel is fixed to the second portion, and
    the chip on film is connected to a bonding region of the display panel on the non-display side.

4. The display device according to claim 2, further comprising:
    a first flexible circuit board, on a display side of the display panel, connected to a bonding region of the display panel, and extending to the non-display side of the display panel, wherein the first flexible circuit board is fixed to the second portion, and the chip on film is bonded to the first flexible circuit board on the second portion.

5. The display device according to claim 1, wherein the chip on film extends to a display side of the display panel and is connected to a bonding region of the display panel.

6. The display device according to claim 1, wherein the heat dissipation layer comprises:
    a heat dissipation film, comprising:
        a first heat dissipation portion, in the driving circuit arranging region, and
        a second heat dissipation portion, in the peripheral region, wherein at least a part of the first heat dissipation portion is insulated from the second heat dissipation portion;
    a buffer layer, on a side of the heat dissipation film close to the display panel.

7. The display device according to claim 6, wherein a material of the heat dissipation film is metal.

8. The display device according to claim 7, wherein the metal comprises copper, copper alloy, silver, silver alloy, aluminum, or aluminum alloy.

9. The display device according to claim 6, wherein the second heat dissipation portion is grounded.

10. The display device according to claim 6, wherein the buffer layer is continuously disposed.

11. The display device according to claim 6, wherein the heat dissipation layer further comprises:
    an adhesive layer, on a side of the buffer layer close to the display panel.

12. The display device according to claim 6, wherein the first heat dissipation portion and the second heat dissipation portion are in a same layer, and a gap is between the second heat dissipation portion and at least a part of the first heat dissipation portion.

13. The display device according to claim 12, wherein the gap comprises an insulation material.

14. The display device according to claim 1, further comprising:
    a protective layer, covering the chip on film.

15. A manufacturing method for manufacturing a display device, comprising:
    providing a display panel;
    disposing a heat dissipation layer on a non-display side of the display panel, wherein the heat dissipation layer comprises a driving circuit arranging region and a peripheral region, and the heat dissipation layer located in at least a part of the driving circuit arranging region is insulated from the heat dissipation layer located in the peripheral region; and
    disposing a chip on film on the driving circuit arranging region.

16. The manufacturing method for manufacturing a display device according to claim 15, wherein the disposing the heat dissipation layer on the non-display side of the display panel comprises:
    forming the heat dissipation layer, wherein the heat dissipation layer comprises the driving circuit arranging region and the peripheral region, and the driving circuit arranging region and the peripheral region are at least partially insulated from each other; and
    connecting the heat dissipation layer to the non-display side of the display panel.

17. The manufacturing method for manufacturing a display device according to claim 15, wherein the disposing the heat dissipation layer on the non-display side of the display panel comprises:
    sequentially forming an adhesive layer, a buffer layer, and a heat dissipation film on the non-display side of the display panel.

18. The manufacturing method for manufacturing a display device according to claim 16, wherein the forming the heat dissipation layer comprises:
    providing a buffer layer;
    providing a heat dissipation film on the buffer layer; and processing the heat dissipation film, to allow the heat dissipation film to form a first heat dissipation portion corresponding to the driving circuit arranging region and a second heat dissipation portion corresponding to the peripheral region.

19. The manufacturing method for manufacturing a display device according to claim 18, wherein the processing the heat dissipation film comprises: cutting the heat dissipation film by a mechanical cutting method or a laser cutting method to remove a part of a material of the heat dissipation film, to form the first heat dissipation portion corresponding to the driving circuit arranging region and the second heat dissipation portion corresponding to the peripheral region.

20. The manufacturing method for manufacturing a display device according to claim 19, further comprising: forming an adhesive layer on a side of the buffer layer away from the heat dissipation film;

the disposing the heat dissipation layer on the non-display side of the display panel comprises: connecting the buffer layer on which the heat dissipation film is formed to the display panel through the adhesive layer.

\* \* \* \* \*